(12) United States Patent
Lin

(10) Patent No.: US 6,559,476 B2
(45) Date of Patent: May 6, 2003

(54) METHOD AND STRUCTURE FOR MEASURING BRIDGE INDUCED BY MASK LAYOUT AMENDMENT

(75) Inventor: Cheng-Nan Lin, Taichung (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/888,584

(22) Filed: Jun. 26, 2001

(65) Prior Publication Data

US 2002/0197748 A1 Dec. 26, 2002

(51) Int. Cl.⁷ .............................................. H01L 23/58
(52) U.S. Cl. .................. 257/48; 257/202; 257/204; 257/206; 257/208; 257/210; 257/211; 257/276
(58) Field of Search ................................ 257/202, 204, 257/206, 208, 210, 211, 276, 48

(56) References Cited

U.S. PATENT DOCUMENTS

| | | | |
|---|---|---|---|
| 4,347,479 A | * 8/1982 | Cullet | 324/64 |
| 4,386,459 A | * 6/1983 | Boulin | 29/574 |
| 5,404,033 A | * 4/1995 | Wong et al. | 257/202 |
| 5,459,355 A | * 10/1995 | Kreifels | 257/758 |
| 5,916,715 A | * 6/1999 | Fulford, Jr. et al. | 430/22 |
| 5,986,283 A | * 11/1999 | Bush et al. | 257/48 |
| 6,118,137 A | * 9/2000 | Fulford, Jr. et al. | 257/48 |
| 6,380,554 B1 | * 4/2002 | Bush et al. | 257/48 |

FOREIGN PATENT DOCUMENTS

| | | | |
|---|---|---|---|
| JP | 5-335308 | * | 5/1993 |
| JP | 5-335305 | * | 12/1993 |
| JP | 5-335308 | * | 12/1993 |

* cited by examiner

*Primary Examiner*—Nathan J. Flynn
*Assistant Examiner*—Ahmed N. Sefer

(57) ABSTRACT

A method for measuring bridge induced by mask layout amendment. Provide a mask with a layout that comprises a conductor line pattern, numerous gate patterns which are connected with conductor line pattern, and numerous contact pattern groups, each contact pattern group has numerous contact patterns and at least surrounds one terminal, which does not contact with conductor line, of one corresponding gate pattern. Then, amend this layout and transfer amended layout into a substrate to form a conductor line, numerous gates and numerous contact groups in and on this substrate. Finally, electrically couple these contact groups with a terminal, then, apply an electrical signal into this conductor line and measure whether the electrical signal appears at this terminal.

7 Claims, 9 Drawing Sheets

METHOD AND STRUCTURE FOR MEASURING BRIDGE INDUCED BY MASK LAYOUT AMENDMENT

BACKGROUND OF THE INVENTION

1. Field of the Invention

This invention relates generally to method, structure, and layout for measuring bridge induced by amendment of mask layout.

2. Description of the Prior Art

Because pattern transferring process usually could not completely transfer pattern of mask into photoresist, and because consumption is not unavoidable during developing process and etching process. Practical patterns in and on substrate usually are different to patterns of mask, and following defects are unavoidable: end rounding, end shorting, corned rounding, critical dimension offset, and bridging phenomena.

Thus, in order to cancel previous defects in practical semiconductor fabrication, mask layout amendment, such as optical proximity correction (OPC), usually is performed after layout pattern is formed and before layout pattern is transferred. Moreover, because pattern of substrate usually is shorter/thinner than pattern of mask or is deformed, mask layout amendment usually widens/lengthens real required patterns of mask or adds auxiliary pattern(s) in neighborhood of real required patterns, to cancel the difference between substrate pattern and mask pattern, to let substrate pattern is equal to real required pattern of mask before mask layout pattern is performed. Furthermore, because mask pattern at least includes numerous elements in practical semiconductor fabrication, mask layout amendment almost is performed by computer in accordance with predetermined rule(s) and predetermined parameter(s). Hence, although both rule(s) and parameter(s) could be adjusted by the operator(s), but operator(s) could amend individual element whenever rule(s) and parameter(s) are determined.

Significantly, because critical dimension of semiconductor devices is continuously decreased and density of semiconductor devices is continuously increased, bridge (bridging phenomena) induced by amendment of neighboring patterns also is continuously increased. Refers to FIG. 1A, FIG. 1B, FIG. 1C, and FIG. 1D, which show relation between real required pattern 10 and amended pattern 11, where FIG. 1B is the case no bridge happens and FIG. 1D is the case bridge happens. Reasonably, because bridge is the side effect during real required pattern 10 is changed into amend pattern 11, appearance of bridge usually could not be eliminated during sequentially pattern transferring process and etching process. An then, undesired bridge usually appears in and on substrate, such as bridge between gate pattern (for forming gate) and neighboring contact pattern (for forming contact) or bridge between gate pattern of one transistor pattern and gate pattern of neighboring transistor pattern, and induces disadvantages such as abnormal short.

Therefore, how to certify no undesired bridge is induced by amendment of mask layout pattern is an indispensable part of mask layout amendment. For well-known technology, because distance between neighboring transistor is obviously larger than distance between gate and contacts of one transistor, also because gate of each transistor is obviously separated from gates of other transistors for popular layout, only bridge between gate and contacts which locates besides this gate is measured, refers to FIG. 2A, FIG. 2B, and FIG. 2C.

Initially, FIG. 2A shows the transistor which should be formed. Layout of the transistor at least includes gate 21 and contacts 22, which locate beside gate 21 and on device area 20 of mask. To check whether such transistor layout could be properly formed without bridge, pattern similar to FIG. 2A is formed on mask as FIG. 2B shows, approximated gate pattern 23 and some approximated contact patterns 24 are formed on amended device area 205 of mask. Herein, configuration of both approximated gate pattern 23 and approximated contact patterns 24 is essentially similar to the configuration of both gate 21 and contacts 22, but the scale and relative distance could be different. Next, pattern shown in FIG. 2B is amended, such as optical proximity correction, and then amended pattern is transferred into substrate 25 to form gate 26 and some contacts 27, as FIG. 2C shows. Herein, to emphasize how to measure bridge, only the case that some bridge occurs for closing gate 26 and contact 27 is shows. Afterward, electrically couples contacts 27 with a terminal, and then applies an electric signal on gate and measure whether this electrical signal appears on this terminal. Indisputably, electrical signal appears on terminal indicates that at least one contact 27 bridge with gate 26, and then it is necessary to amended approximated gate pattern 23 and approximated contact patterns 24 of FIG. 2B. Of course, it also could be viewed as this transistor layout could not be formed by current mask layout amendment or current mask layout amendment must be improved.

Surely, amendment of FIG. 2B not only requires message(s) about whether bridge is happened but also requires message(s) about what distance between gate 21 and contact 22 could prevent occurrence of bridge. Thus, as FIG. 2D shows, the popular solution is to form a mask layout pattern which connects several stimulated gate patterns 29 by one conductor line pattern 28. Herein, each stimulated gate pattern 29 is briefly similar to, or even equal to, other stimulated gate patterns 29, and each stimulated gate pattern 29 corresponds to several stimulated contact patterns 295 which are located beside it. Moreover, the distance between one stimulated gate pattern 29 and corresponding stimulated contact patterns 295 is different from the distance between each other stimulated gate pattern 29 and corresponding stimulated contact patterns. Clearly, after mask layout amendment and pattern transferring process, gates 26 and contacts 27 are formed on substrate 295 and are corresponding to stimulated gate patterns 29 and stimulated contact patterns 295. In this way, by measuring which gate 26 has bridge(s) with corresponding contact(s) 27 and which gate 26 has no bridge with corresponding contact 27, it is clear which stimulated gate pattern 29 and corresponding stimulated contact pattern 295 could to indicate both gate 21 and contacts 22 on mask, and could be ensure correctly pattern transfer without bridge.

However, owing to density of semiconductor devices is continuously increased and layout of semiconductor devices also is continuously evolved, not only distance between neighboring transistors approaches to the distance between gate and contacts of same transistor, but also gate of each semiconductor devices is close to gates of other semiconductor devices, such as static random access memory. Thus, conventional technology which only measures bridge between gate and contacts of same transistor could not handle all possible bridge. For example, while pattern to be formed is similar to FIG. 2A but gate 21 is longer than FIG. 2A, as FIG. 2E shows, it is possible that terminal of gate 26 is widen or is like a hammerheads, which usually called as endcap phenomena, although no bridge is happened. Obviously, whenever two neighboring transistors are so close to let they can not be separated during mask layout amendment, it is possible that gate of one transistor has bridge with gate of neighboring transistor, as FIG. 2F shows. Of course, FIG. 2F only shows one possible bridge, it also could be bridge between gate of one transistor and contact(s) of neighboring transistor, and also could be bridge between contact(s) of one transistor and contact(s) of neighboring contact(s).

As a summary, conventional technology only could measure bridge induced by both deformation of gate and deformation of contact(s) of same transistor during mask layout amendment, bit could not handle bridge induced by other reasons. Therefore, it is desired to amend conventional technology to correctly handle all possible bridge and to ensure accuracy of mask layout.

SUMMARY OF THE INVENTION

According to previous defects of conventional technology, one main object of this invention is to provide a method for handling all possible bridges.

One preferred embodiment of this invention is a method for measuring bridge induced by mask layout amendment. First, provide a mask with a layout that comprises a conductor line pattern, numerous gate patterns which are connected with conductor line pattern, and numerous contact pattern groups, each contact pattern group has numerous contact patterns and at least surrounds one terminal, which does not contact with conductor line, of one corresponding gate pattern. Then, amend this layout and transfer amended layout into a substrate to form a conductor line, numerous gates and numerous contact groups in and on this substrate. Finally, electrically couple these contact groups with a terminal, then, apply an electrical signal into this conductor line and measure whether the electrical signal appears at this terminal.

Another preferred embodiment is a layout for measuring deformation of gate pattern which induced by layout amendment, at lest includes a conductor line pattern, numerous gate patterns which connects with conductor line pattern, and numerous contact pattern groups. Herein, each contact pattern group is separated with other contact pattern groups and is corresponding to one gate pattern, and has numerous contact patterns that surround one terminal which does not contact with conductor line pattern of gate pattern.

Yet a preferred embodiment is a structure for measuring bridge between gate and contact, at least includes gate which is located on a substrate, dielectric layer which covers both substrate and gate, numerous contacts which are located in dielectric layer and contacted with substrate. These contacts at least surround part of gate and each contact is separated from other contacts. And Conductor layer is located over dielectric layer and electrically coupled with contacts.

BRIEF DESCRIPTION OF THE DRAWINGS

A more complete appreciation and many of the attendant advantages will be readily obtained as the same becomes better understood by reference to the following detailed description when considered in connection with the accompanying drawings.

DESCRIPTION OF THE PREFERRED EMBODIMENT

Figure 1A:
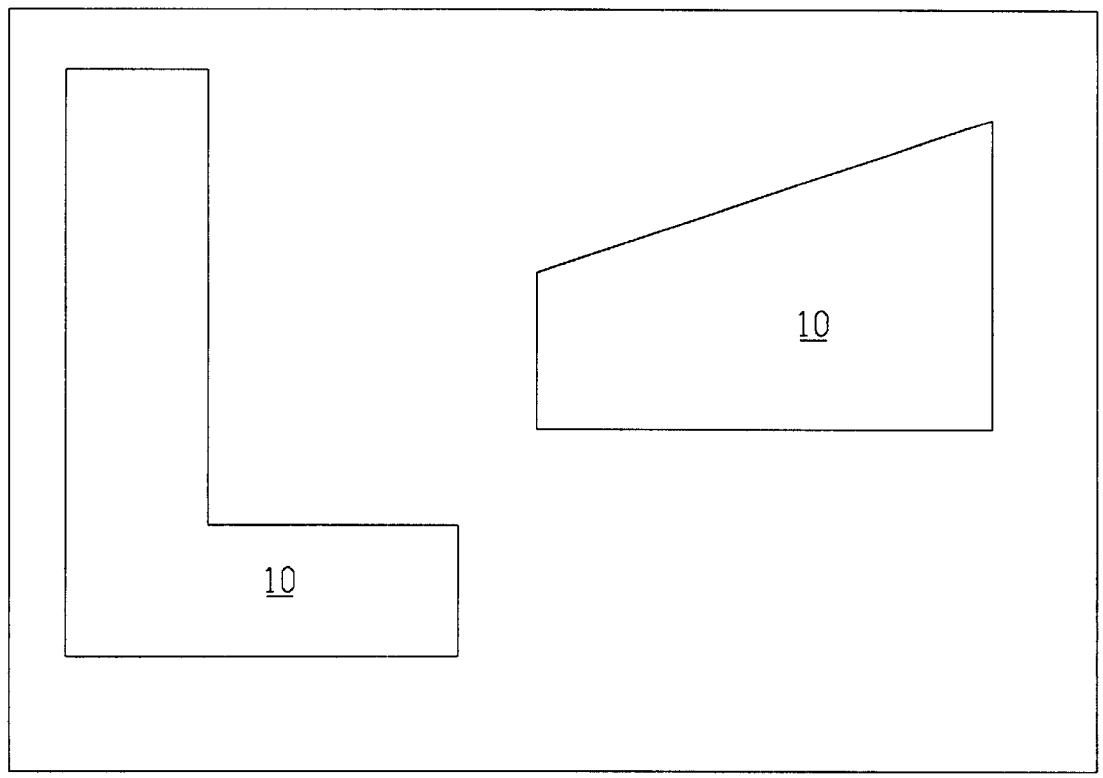
FIG. 1A through FIG. 1D show the relation between real required pattern and amended pattern, and further show the case bridge is happened and the case bridge is not happened.
Figure 1B:
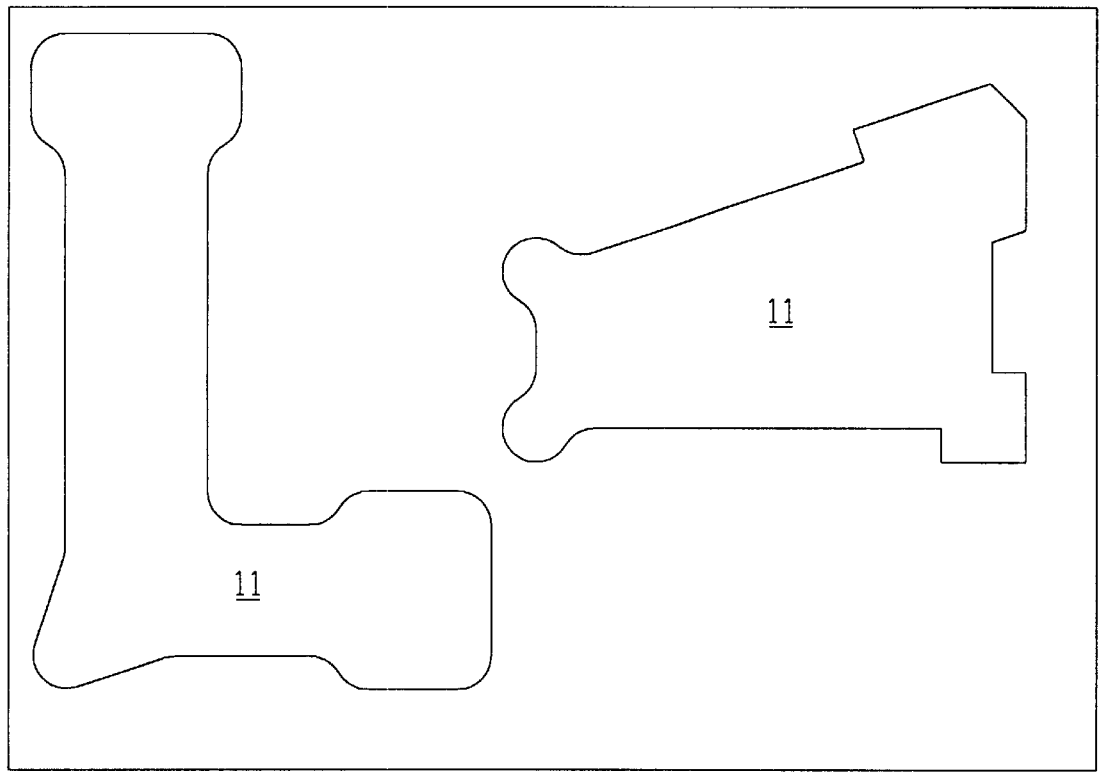
Figure 1C:
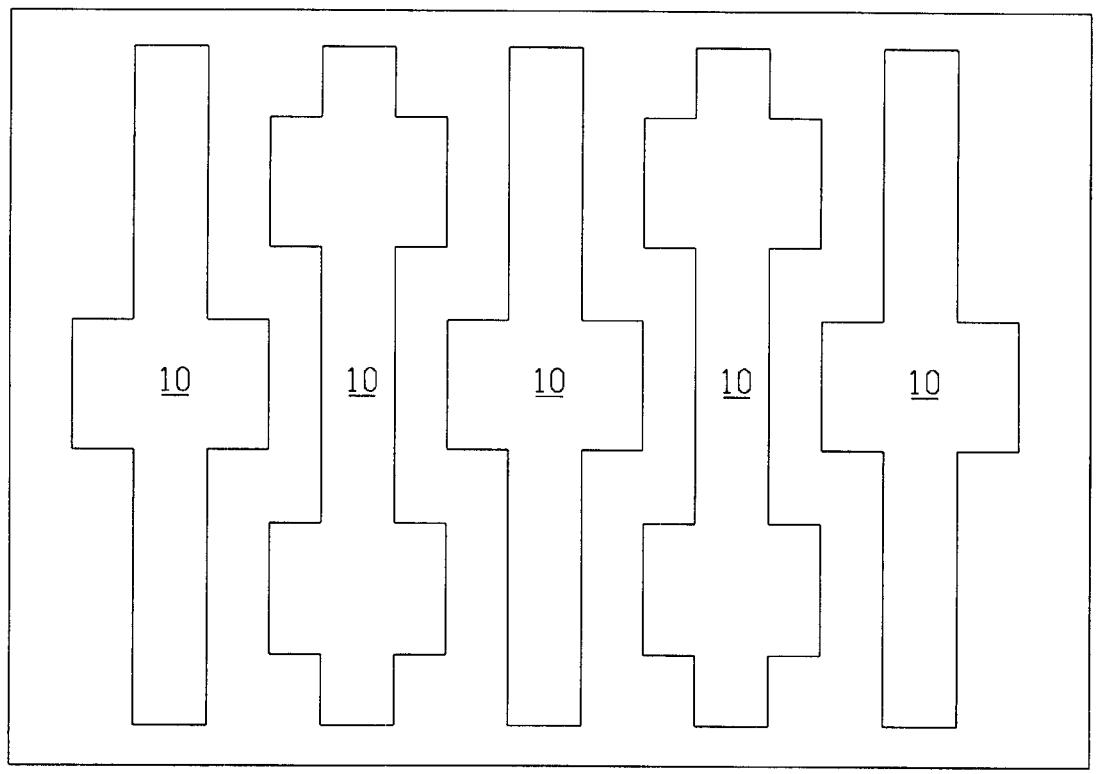
Figure 1D:
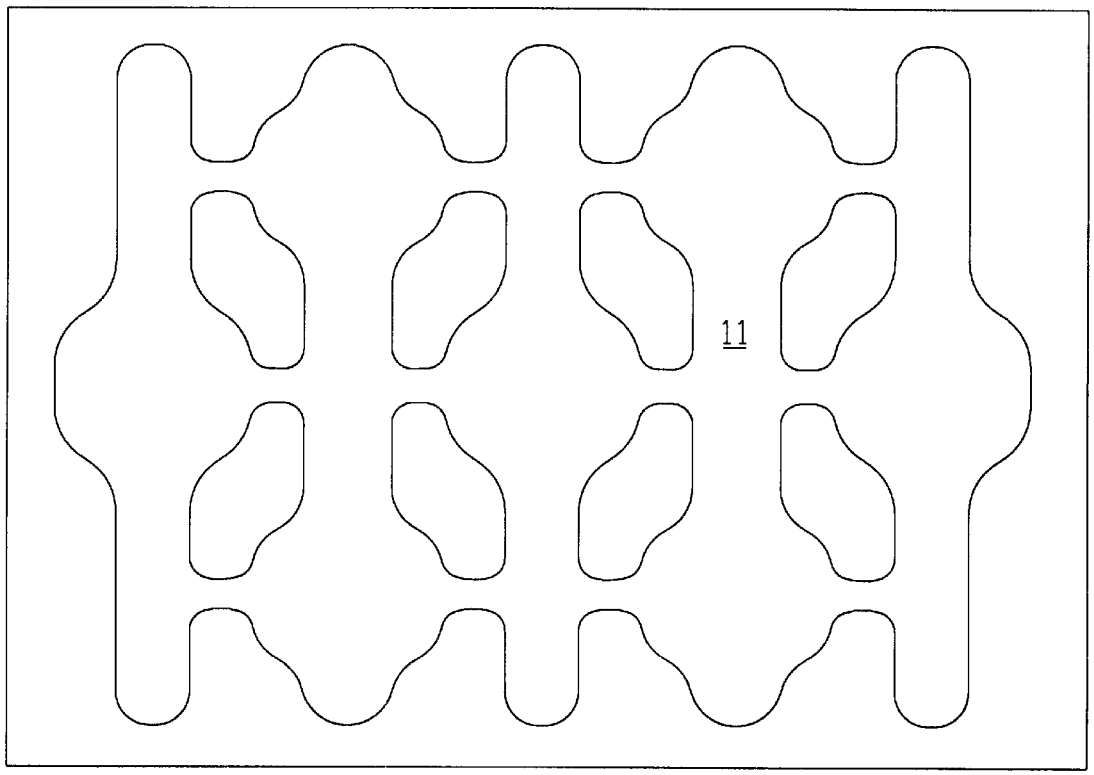
Figure 2A:
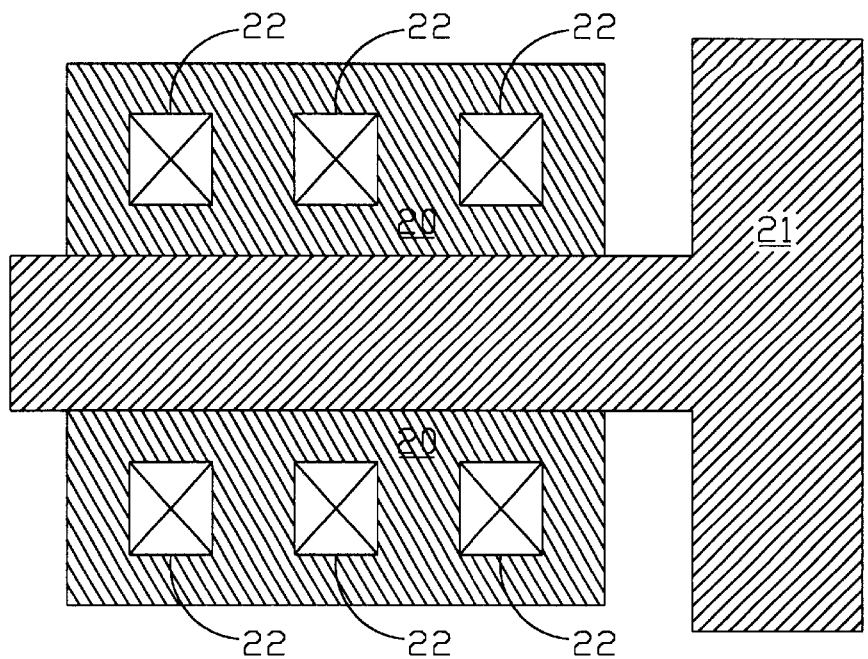
FIG. 2A through FIG. 2F are some brief illustrations for showing idea, contents, and disadvantageous of conventional technology.
Figure 2B:
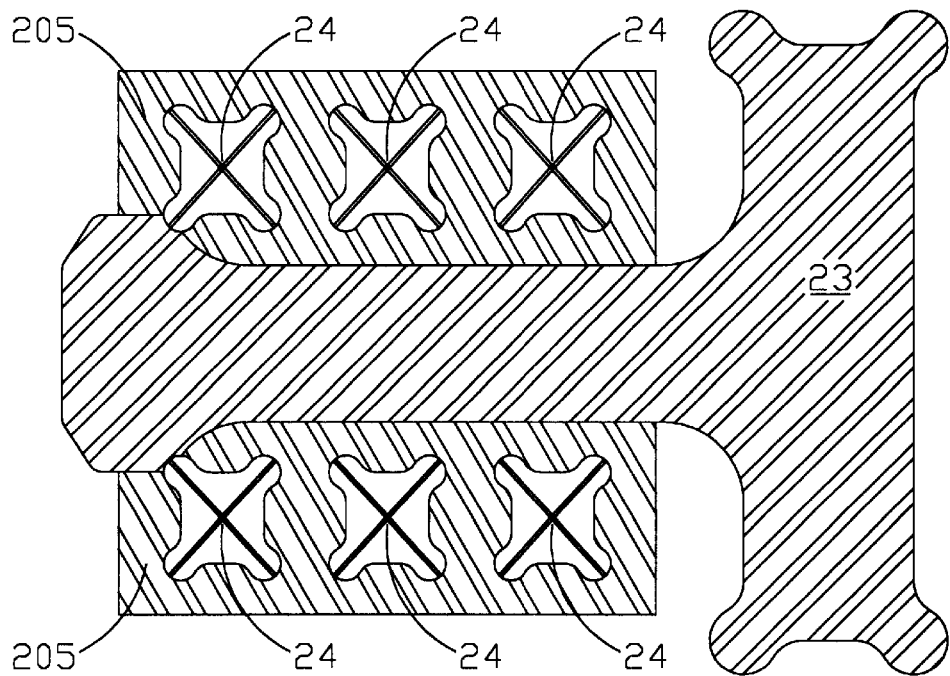
Figure 2C:
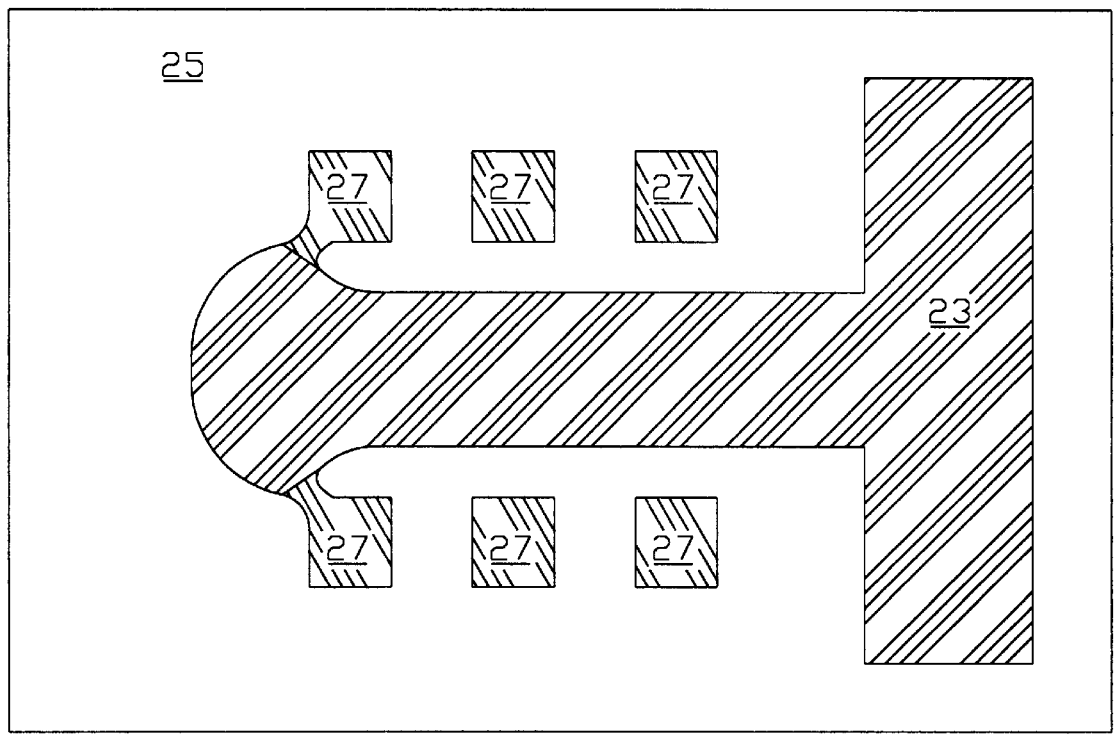
Figure 2D:
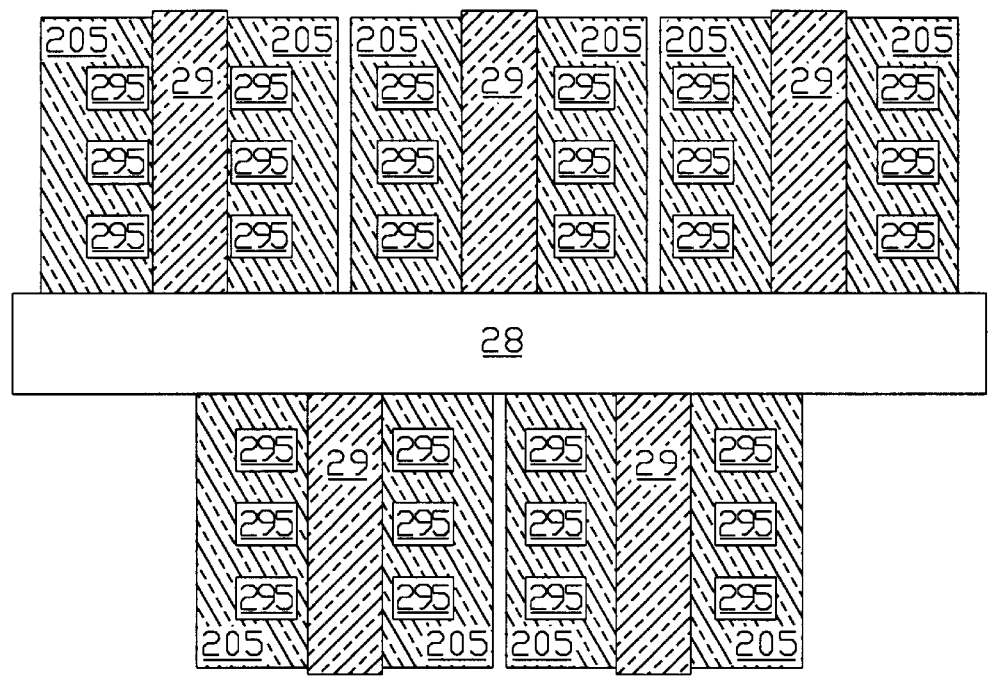
Figure 2E:
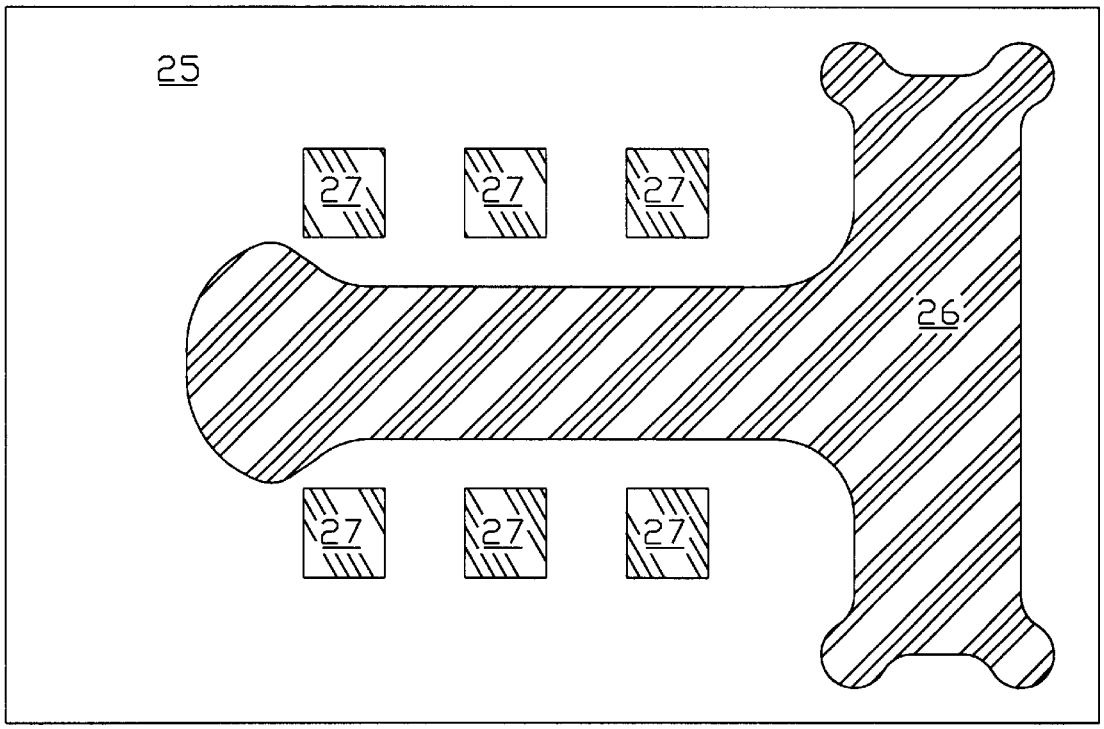
Figure 2F:
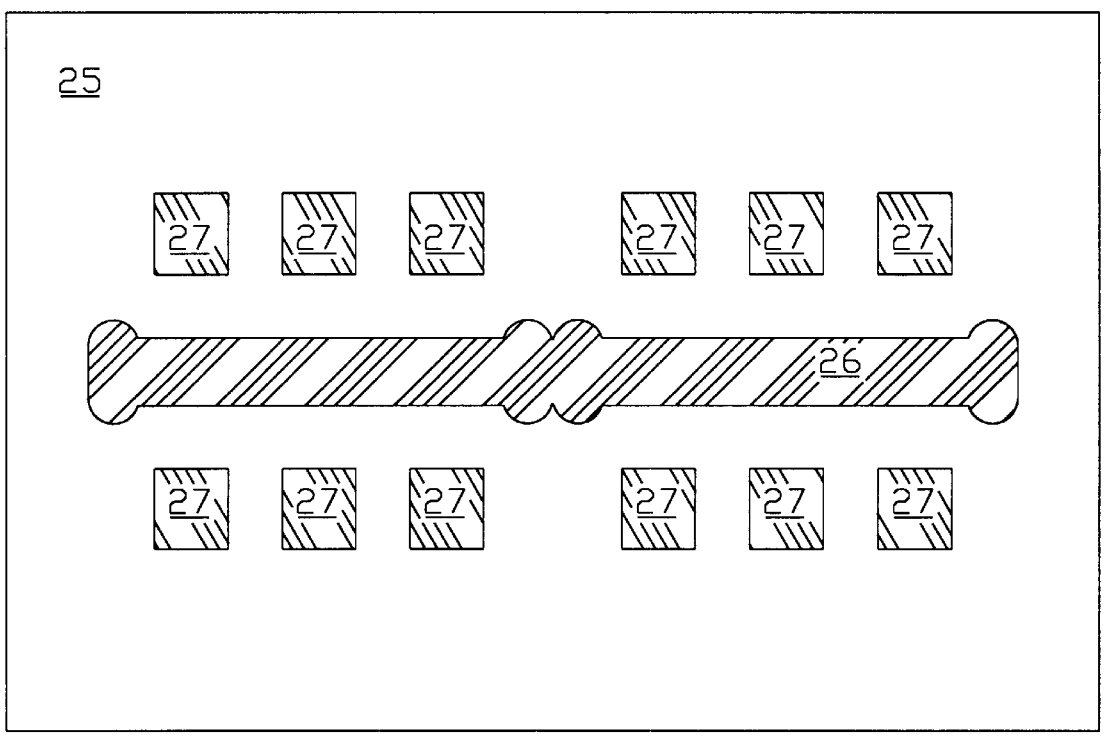

By carefully analysising FIG. 2D through FIG. 2F, clearly, conventional technology only considers defects induced by widen gate by measuring bridge between gate and contacts which locates beside gate, but never consider any defects induced by lengthen gate. Further, by comparing FIG. 2C and FIG. 2F, clearly, although conventional technology considers bridge between gate and contacts of same transistor which induced by widen terminal of gate, conventional technology never considers any bridge between different transistors which induced by widen/lengthen terminal of gate. In other words, conventional technology never measures, ever never considers, any defects induced by widen terminal and/or lengthen terminal of gate.

Aims at above problem, basic concept of this invention is to amend the relation between stimulated gate pattern and stimulated contact patterns, or called as the relation between approximated gate pattern and approximated contact patterns, such that stimulated contact patterns surround stimulated gate pattern but not only are located beside stimulated gate pattern as what conventional technology do. Moreover, in order to handle all bridge induced by widen/lengthen terminal of gate, it is better that stimulated contact patterns surround terminal of stimulated gate pattern, and more better that at least one stimulated contact pattern is close to terminal of stimulated gate pattern or is located :n extend zone of stimulated gate pattern terminal.

To further explain concept of this invention, one preferred embodiment of this invnetion is a layout for measuring deformation of gate pattern which induced by layout amendment. As FIG. 2A and FIG. 3B show, this embodiment at lest includes conductor line pattern 31, numerous gate patterns 32 which are located in device area 30, and numerous contact pattern groups where each has numerous contact patterns 33. Herein, each contact pattern group is separated with other contact pattern groups and is corresponding to one gate pattern, and has numerous contact patterns that surround one terminal which does not contact with conductor line pattern of gate pattern.

Figure 3A:
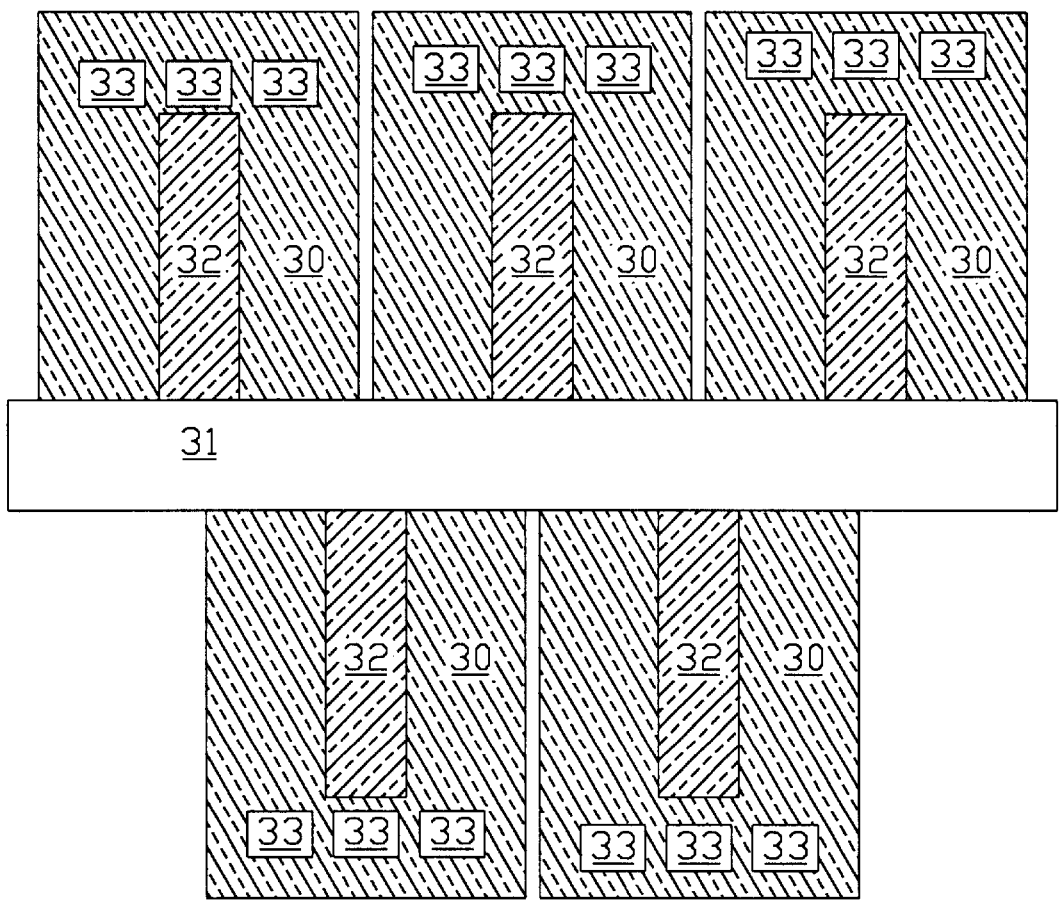
FIG. 3A through FIG. 3C are some brief illustrations of one preferred embodiment of this present invention.
Figure 3B:
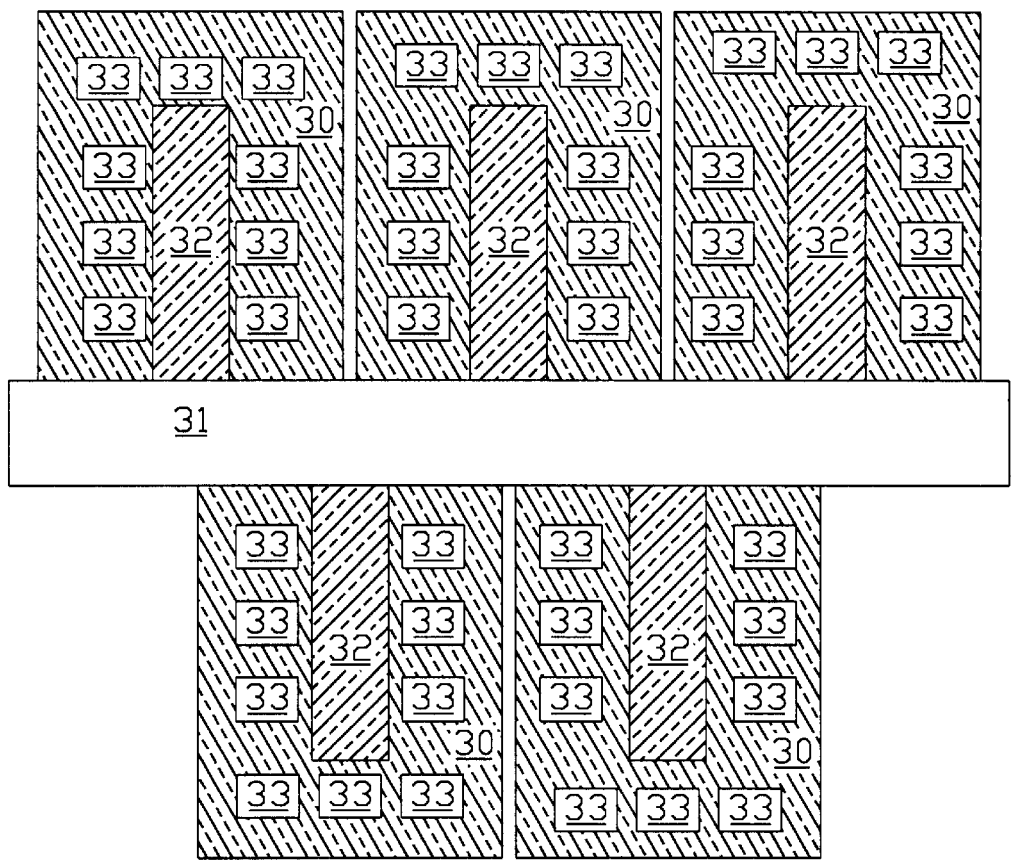

As shown in FIG. 3A and FIG. 3B, each gate pattern 32 connects with conductor line pattern 31 and is separated with other gate patterns 32. Moreover, each contact pattern group also is separated with other contact pattern groups, and each contact pattern groups does not touch with any gate pattern 32. In fact, the corresponding relation between contact pattern groups and gate patterns 32 is one by one, and contact patterns of one contact pattern group at least surround one terminal, which does not touch conductor line pattern 31, of gate pattern 32.

Indisputably, FIG. 3A shows the case only lengthen and/or widen terminal of gate pattern 32 is measured, and FIG. 3B shows the case that is combination of both FIG. 3A and conventional technology. FIG. 3A clearly emphasizes the difference between this embodiment and conventional technology, and FIG. 3B apply this embodiment to measure all possible bridges that are induced by deformation of gate pattern.

Figure 3C:
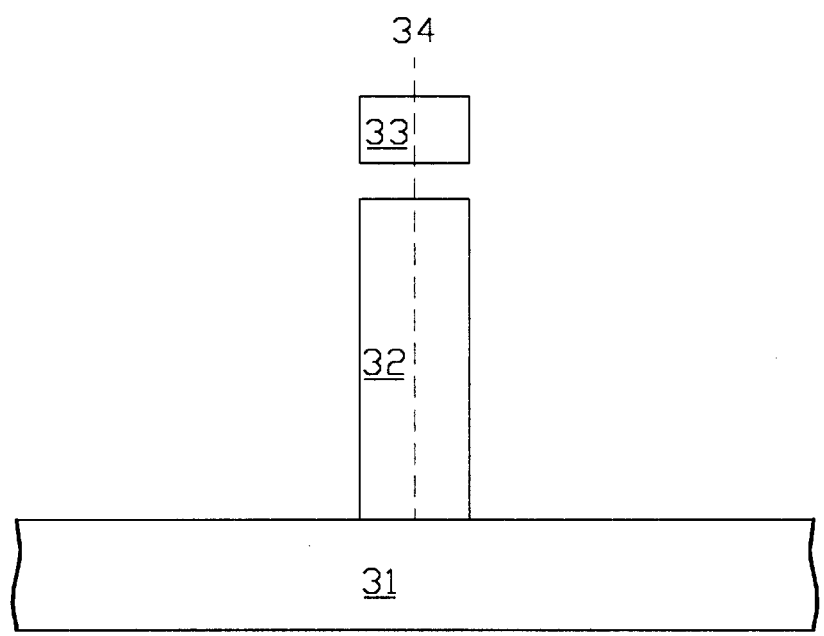

Furthermore, to ensure deformation of terminal of gate pattern 32 could be measured, it is better to let each contact patterns group has at least one contact pattern 33 which is close to terminal of corresponding gate pattern 32. Further, as FIG. 3C shows, whenever terminal of gate pattern 32 which is surrounded by corresponding contact pattern group is elongated along an axis, it also is suitable to let at least one contact pattern locate on the axis but does not touch with gate pattern 32.

Surely, this embodiment also could be applied to measure numerous different transistor layout at the same time, which means shape of different gate pattern 32 could be different and/or distribution/number of contact patterns of different contact pattern groups are different. However, as shown in FIG. 2D and corresponding discussion, in order to ensure how far could avoid appearance of bridge between gate pattern 32 and contact pattern group and to ensure how far could avoid bridge between neighboring gate patterns 32. In general, each gate pattern 32 is similar to, or even equal to, to other gate patterns 32, and distribution of contact patterns of each contact pattern group also is similar to, or even equal to, distribution of other contact pattern group. Herein, the distance between any gate pattern 32 and contact patterns of corresponding contact pattern group is different to the distance between each other gate pattern 32 and contact patterns of corresponding contact pattern group. For example, it is possible that the distance between one gate pattern 32 and one contact pattern 33, which is located close to one terminal of this gate pattern 32 which does not contact with conductor line pattern 31, of corresponding one contact pattern group is different from the distance between each other gate pattern 32 and one contact pattern 33, which is located close to one terminal of this gate pattern 32 which does not contact with conductor line pattern 31, of corresponding one contact pattern group. For example, it also is possible that the distance between one gate pattern 32 and one contact pattern 33, which is located beside this gate pattern 32, of corresponding one contact pattern group is different from the distance between each other gate pattern 32 and one contact pattern 33, which is located beside this gate pattern 32 of corresponding one contact pattern group.

Figure 4:
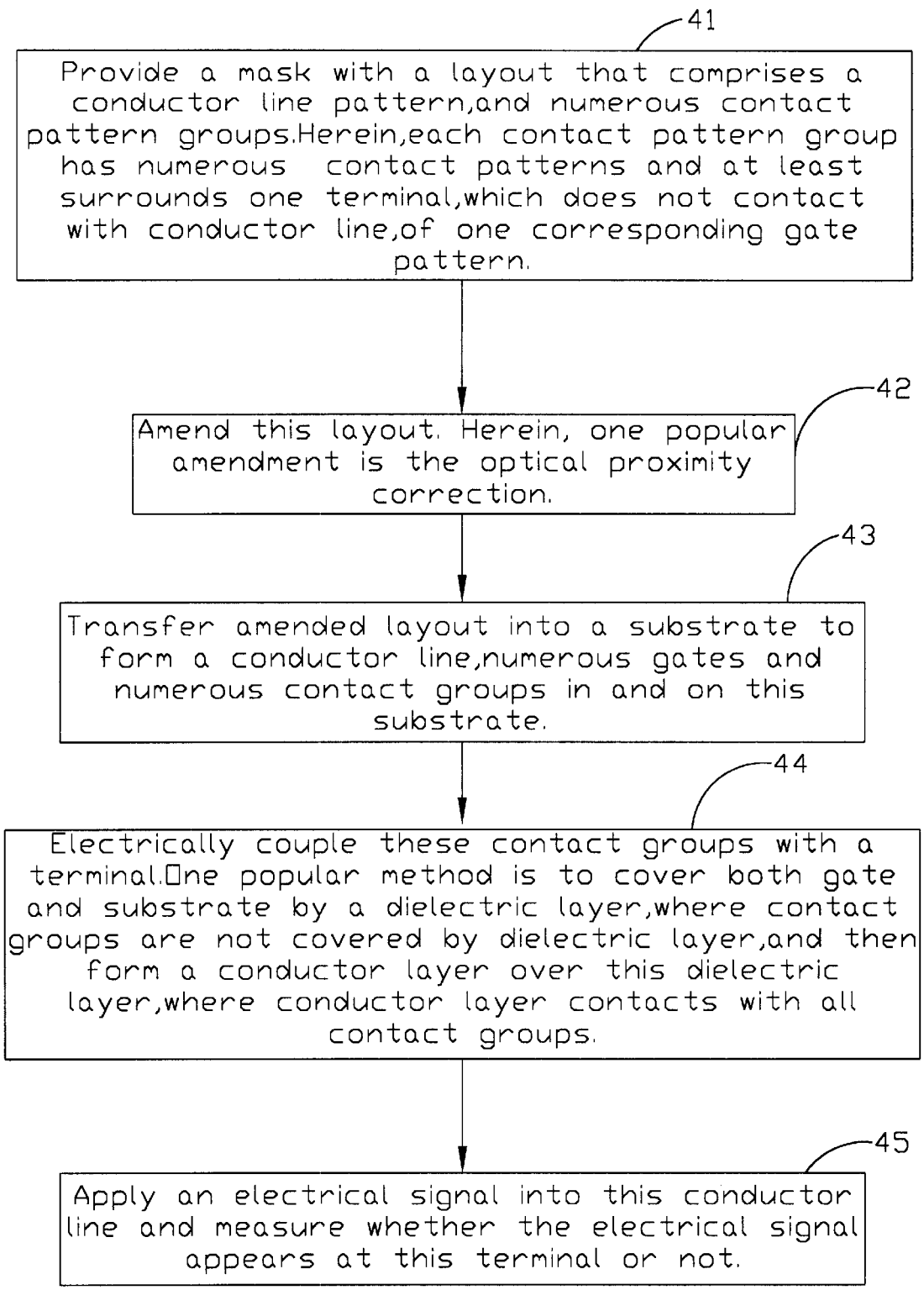
FIG. 4 is brief illustration of another preferred embodiment of this present invention.

Another preferred embodiment of this invention is an application of former embodiment: a method for measuring bridge induced by mask layout amendment. As FIG. 4 shows, this embodiment at least includes following steps:

As mask layout block 41 shows, provide a mask with a layout that comprises a conductor line pattern, numerous gate patterns which are connected with conductor line pattern, and numerous contact pattern groups. Herein, each contact pattern group has numerous contact patterns and at least surrounds one terminal, which does not contact with conductor line, of one corresponding gate pattern. In short, mask layout of this embodiment is the mask layer present by former embodiment.

As usual, this embodiment al least satisfies one of following limitations. First, contact patterns of each contact pattern group arrange along the border of corresponding gate pattern, and each contact pattern group at least has one contact pattern located close to one terminal, which does not contact with conductor line pattern, of gate pattern. Second, the distance between contact patterns and corresponding gate pattern of each contact pattern group is different from the distance of any other contact pattern group. Third, the distance between one gate pattern and one contact pattern, which is located close to one terminal of this gate pattern which does not contact with conductor line pattern, of corresponding one contact pattern group is different from the distance between each other gate pattern and one contact pattern, which is located close to one terminal of this gate pattern which does not contact with conductor line pattern, of corresponding one contact pattern group.

As amendment block 42 shows, amend this layout. Herein, layout is automatically amended by a computer in accordance with at lest one rule which is predetermined by an operator. And one popular amendment is the optical proximity correction As transfer block 43 shows, transfer amended layout into a substrate to form a conductor line, numerous gates and numerous contact groups in and on this substrate.

As couple block 44 shows, electrically couple these contact groups with a terminal. One popular method is to cover both gate and substrate by a dielectric layer, where contact groups are not covered by dielectric layer, and then form a conductor layer over this dielectric layer, where conductor layer contacts with all contact groups.

As measure block 45 shows, apply an electrical signal into this conductor line and measure whether the electrical signal appears at this terminal or not.

Figure 5A:
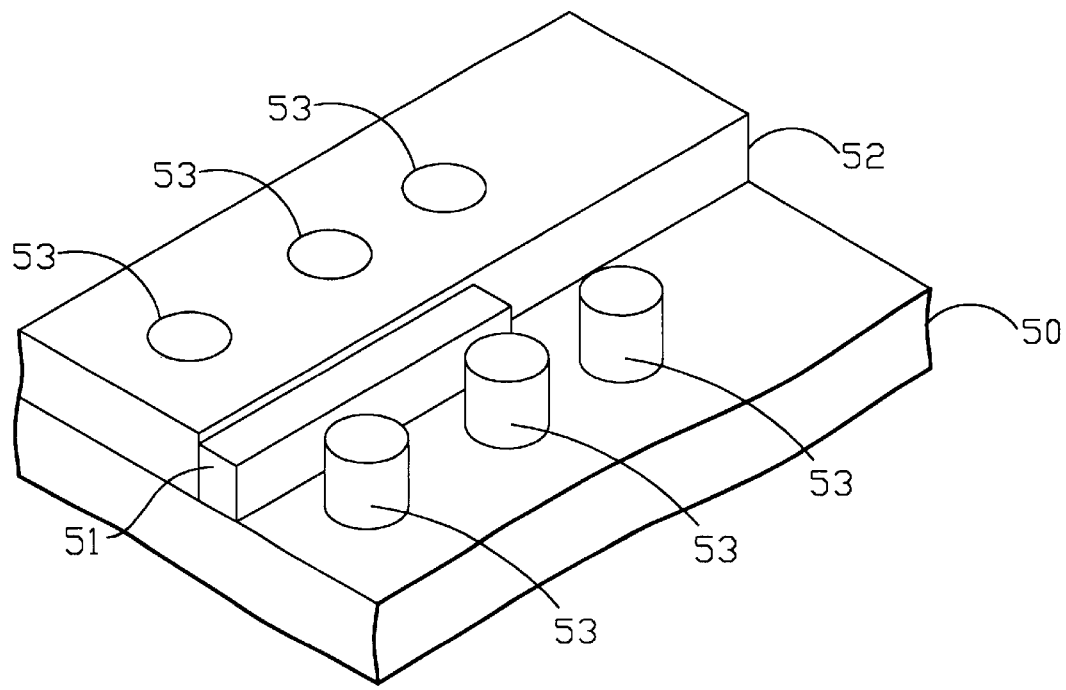
FIG. 5A and FIG. 5B are some brief illustration of the other preferred embodiment of this present invention.
Figure 5B:
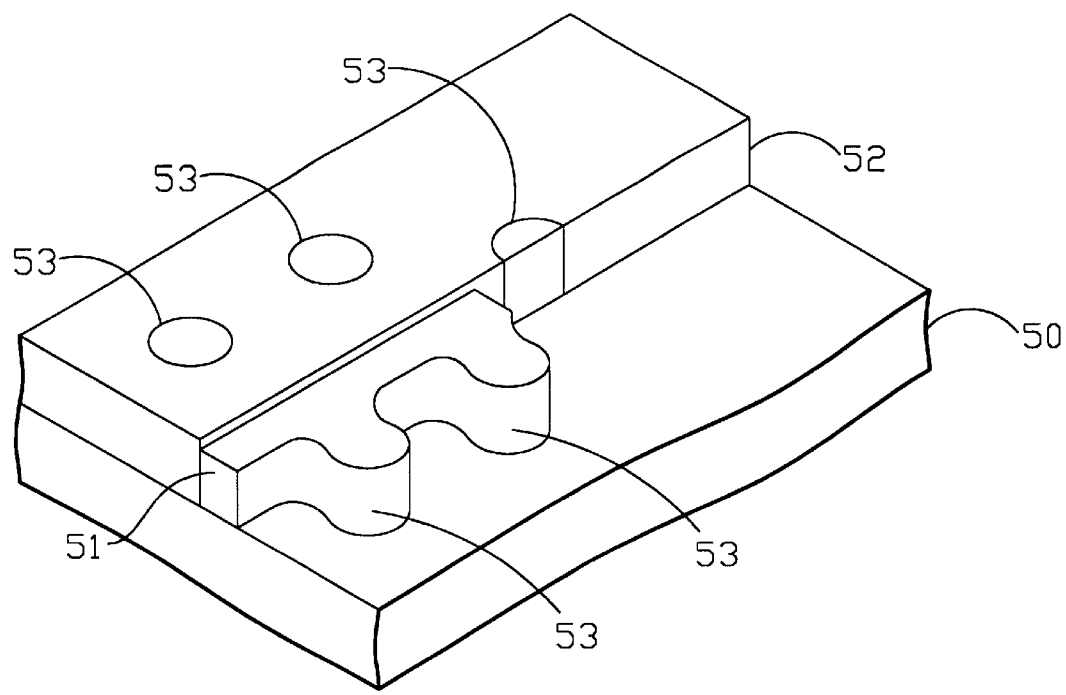

Yet a preferred embodiment of this invention is a structure for measuring bridge between gate and contact. As shown in FIG. 5A and FIG. 5B, the embodiment at least includes gate 51, dielectric layer 52, numerous contacts 53, and conductor layer. Herein, in order to simplify figures, conductor layer is not shown in FIG. 5A and FIG. 5B, and only partial structure is shown.

Gate 51 is located on substrate 50. Dielectric layer 52 covers both substrate 50 and gate 51, but does not cover any contact 53. These contacts 53 are located in dielectric layer 52 and contacted with substrate 50, these contacts 53 at least surround part of gate 51 and each contact 53 is separated from other contacts 53. Conductor layer is located over dielectric layer 52 and electrically couples with contacts 53.

As usual, contacts 53 are arranged along the border of gate 51. Also, at least one contact 53 usually is located close to one terminal of gate 53. Further, whenever one terminal of gate 51 which is surrounded by contacts 53 elongates along an axis, as usual at least one contact 53 is located on the axis but is separated from gate 51.

Besides, gate 51 usually is electrically coupled with an electric source and conductor layer 43 usually is electrically coupled with a detector. The detector is used to measure any signal which flows from 51 gate through at least one conduct 52, which bridges with gate 51, into conductor layer 53.

Obviously, structure of this embodiment could be achieved by transferring mask layout of other two embodiments into substrate, and then configuration of gate and contacts of this embodiment is decided by amended layout, such as amended by optical proximity correction of mask. However, this embodiment is not limited by how the structure is formed. Besides, the embodiment could be used to detect any bridge induced by gate deformation, and the embodiment does not care whether this bridge by mask layout amendment or by mistakes of both developing process and etching process.

From the foregoing it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. A layout for measuring deformation of gate pattern which induced by layout amendment, comprising a conductor line pattern;

a plurality of gate patterns, each said gate patterns being separated with other said gate patterns, said gate patterns being connected with said conductor line pattern; and a plurality of contact pattern groups, each said contact pattern groups being separated with other said contact pattern groups, said contact pattern groups being not contacted with said gate patterns, each said contact pattern group being corresponding to one said gate pattern and comprising:

a plurality of contact patterns, each said contact pattern being separated from other said contact patterns, said contact patterns surrounding one terminal, which does not contact with said conductor line pattern, of said gate pattern.

2. The layout of claim 1, shape of each said gate pattern being similar to shape of other gate patterns.

3. The layout of claim 2, distribution of said contact patterns of each contact pattern group being similar to distribution of said contact patterns of other said contact patterns groups.

4. The layout of claim 2, the distance between said contact patterns of one said contact pattern group and one corresponding said gate pattern being different from the distance between said contact patterns of any other said contact pattern group and one corresponding said gate pattern.

5. The layout of claim 1, whenever one terminal of one said gate pattern, which is surrounded by one corresponding said contact pattern group, elongates along an axis, at least one said contact pattern of corresponding said contact pattern group being located on said axis but being separated from said gate pattern.

6. The layout of claim 1, each said contact pattern group at least having one said contact pattern being located close to one terminal, which does not contact with said conductor line pattern, of corresponding said gate pattern.

7. The layout of claim 6, the distance between one said gate pattern and one said contact pattern, which is located closed to one terminal of this said gate pattern which does not contact with said conductor line pattern, of corresponding one said contact pattern group is different from the distance between each other said gate pattern and one said contact pattern, which is located closed to one terminal of this said gate pattern which does not contact with said conductor line pattern, of corresponding one said contact pattern group.

* * * * *